United States Patent [19]
Heck et al.

[11] Patent Number: 4,739,285
[45] Date of Patent: Apr. 19, 1988

[54] OSCILLATOR HAVING ALL-PASS FILTER WITH RESISTANCE BRIDGE FOR DETECTING PHYSICAL PARAMETERS

[75] Inventors: Bernd Heck; Dierk Schröder, both of Hamburg, Fed. Rep. of Germany

[73] Assignee: U.S. Philips Corporation, New York, N.Y.

[21] Appl. No.: 26,590

[22] Filed: Mar. 17, 1987

[30] Foreign Application Priority Data

Mar. 20, 1986 [DE] Fed. Rep. of Germany ....... 3609358

[51] Int. Cl.$^4$ ........................... G01L 1/22; G01L 9/04
[52] U.S. Cl. ....................................... 331/65; 73/767; 324/DIG. 1
[58] Field of Search ...................... 331/65, 66; 73/763, 73/767; 340/665, 626; 324/DIG. 1

[56] References Cited
U.S. PATENT DOCUMENTS 3,845,385 10/1974 Ebrecht ............................ 331/65 X
4,546,651 10/1985 Merrick ............................ 331/65 X

*Primary Examiner*—Siegfried H. Grimm
*Attorney, Agent, or Firm*—David R. Treacy; Bernard Franzblau

[57] ABSTRACT

A measuring oscillator for detecting different physical parameters has an all-pass filter (1) which drives a current source (16) having a controllable amplification factor and a control device (17). The control device is connected to the control input of the current source (16) and controls its amplification factor so that the amplitude of the alternating voltage produced by the measuring oscillator assumes a constant value. The all-pass filter comprises a phase-determining bipolar circuit (10) comprising a voltage follower (12) having its input connected to the first pole (9) of the circuit (10) and its output connected through bridge circuit (28) to the inputs of a differential amplifier circuit (33). The four resistance elements (29-32) of the bridge circuit have resistance values varying with the physical parameters to be detected. The output of the differential amplifier circuit is connected through an ohmic resistor (41) to the first pole. The second pole (11) of the bipolar circuit (10) is connected to the junction of the two resistance elements (31, 30) of the bridge circuit. A variation of a resistance element of the bridge circuit due to a variation of the physical parameter detected by it results in a readily measurable variation of the frequency of the measuring oscillator.

7 Claims, 1 Drawing Sheet

OSCILLATOR HAVING ALL-PASS FILTER WITH RESISTANCE BRIDGE FOR DETECTING PHYSICAL PARAMETERS

BACKGROUND OF THE INVENTION

The invention relates to a measuring oscillator for detecting physical parameters, more particularly pressure, which produces a signal having a frequency dependent upon the physical parameter and which comprises an amplifier fed back positively through an all pass filter. The all-pass filter comprises a phase-determining circuit element which is constructed as a bipolar circuit arrangement having a parameter-dependent ohmic measuring resistance whose resistance variation, which can be detected by the all-pass filter, is larger upon variation of the parameter value than the resistance variation itself.

A measuring oscillator of the kind described in the opening paragraph is disclosed in U.S. patent application Ser. No. 892,604 filed Aug. 4, 1986, in which the all-pass filter is connected to a measuring resistor having a temperature-dependent ohmic resistance. Although essentially this temperature-dependent ohmic resistor may be replaced by a resistor whose resistance value varies in dependence upon the variation of other physical parameters so that the measuring oscillator produces a signal having a parameter-dependent frequency, it has been found that the sensitivity is then not sufficient to detect accurately all parameter variations.

SUMMARY OF THE INVENTION

The present invention has for an object to increase the sensitivity of the measuring oscillator to such an extent that small variations of the physical parameter to be detected result in comparatively large readily measurable variations of the oscillator frequency.

According to the invention, this object is achieved in that in the bipolar circuit arrangement the measuring resistor is composed of four resistance elements having resistance values variable as a function of the physical parameters to be detected and cooperating in a bridge circuit.

When the variable ohmic resistance that can be detected by the all-pass filter is constituted by a bridge circuit, the sensitivity of the measuring oscillator as a whole is increased so that other physical parameters, for example pressure, also can be detected with a high sensitivity.

Advantageously, the bipolar circuit arrangement comprises a voltage follower whose input is connected to a first pole (terminal) of the circuit arrangement and whose output is connected to a pole of a first diagonal branch of the quadrupolar bridge circuit, while the other pole of the first diagonal branch of the quadrapolar bridge circuit is connected to a second pole of the bipolar circuit arrangement. The two poles of the second diagonal branch of the bridge circuit are connected to inputs of a differential amplifier circuit arrangement whose output signal controls the current in the all-pass filter through the first pole of the circuit arrangement. Upon a variation of the resistance of any of the parameter dependent resistance elements of the bridge circuit, i.e. when solely a deviation between otherwise similar quantities should be detected, a differential amplifier circuit arrangement is very suitable to detect this variation.

According to a further advantageous embodiment of the invention, the differential amplifier circuit essentially comprises two first operational amplifiers, which are fed back through their negative inputs and whose positive inputs are each connected to respective poles of the second diagonal branch of the bridge circuit, as well as a succeeding third operational amplifier whose positive input is connected to the output of one first operational amplifier and whose negative input is connected to the output of the other operational amplifier. Thus, a differential amplifier circuit is provided which can be manufactured at low cost because the operational amplifiers themselves can be obtained as integrated standard elements, i.e. both as individual separate integrated elements and in the form of fully integrated differential amplifiers in one element.

In a further embodiment of the invention, the output of the differential amplifier circuit is connected to the input of a non-inverting amplifier, whose output is connected through a resistor to the first pole of the circuit arrangement. This non-inverting amplifier may be necessary for reducing the amplification factor of the differential amplifier to reduce phase errors.

In particular, in order that forces or pressures can be measured, the resistance elements constituting the bridge circuit are constructed as strain gauges.

BRIEF DESCRIPTION OF THE DRAWINGS

In order that the invention may be readily carried out, it will now be described more fully, by way of example, with reference to the accompanying drawing, in which.

DESCRIPTION OF THE PREFERRED EMBODIMENTS

Figure 1:
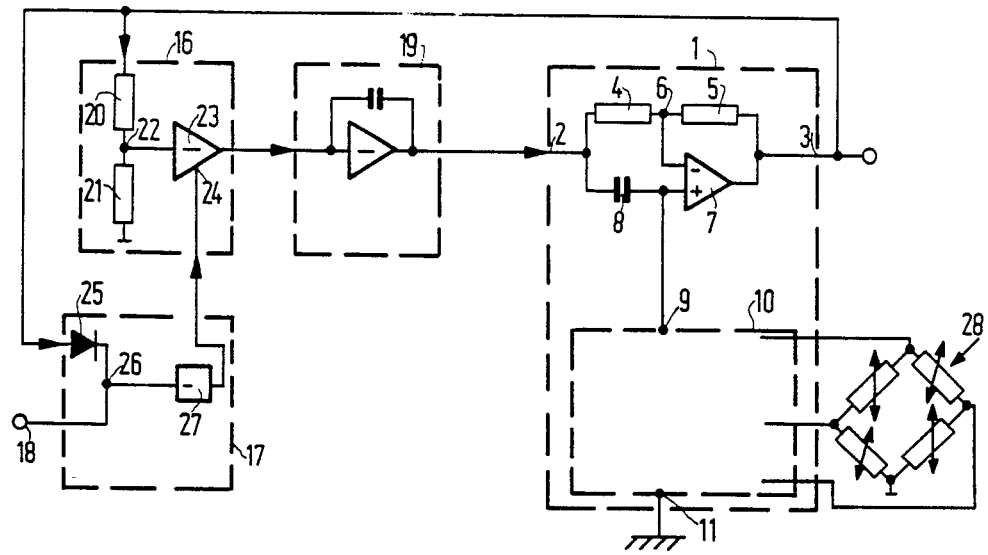
FIG. 1 shows a circuit diagram of a measuring oscialator.

The oscillator shown in FIG. 1 comprises an all-pass filter 1 of the first order, whose input 2 and whose output 3 are connected to each other through an ohmic voltage divider 4,5. The centre tapping 6 on the ohmic voltage divider 4,5 is connected to the inverting input of an operational amplifier 7, whose output is connected to the output 3 of the all-pass filter 1. The non-inverting input of the operational amplifier 7 is connected through a capacitor 8 to the input 2 of the all-pass filter 1 and further to the first pole 9 of a bipolar circuit element 10, whose second pole 11 is connected to ground. The bipolar circuit arrangement 10 is connected to a measuring resistor 28, which is in the form of a quadrupolar bridge circuit.

Figure 2:
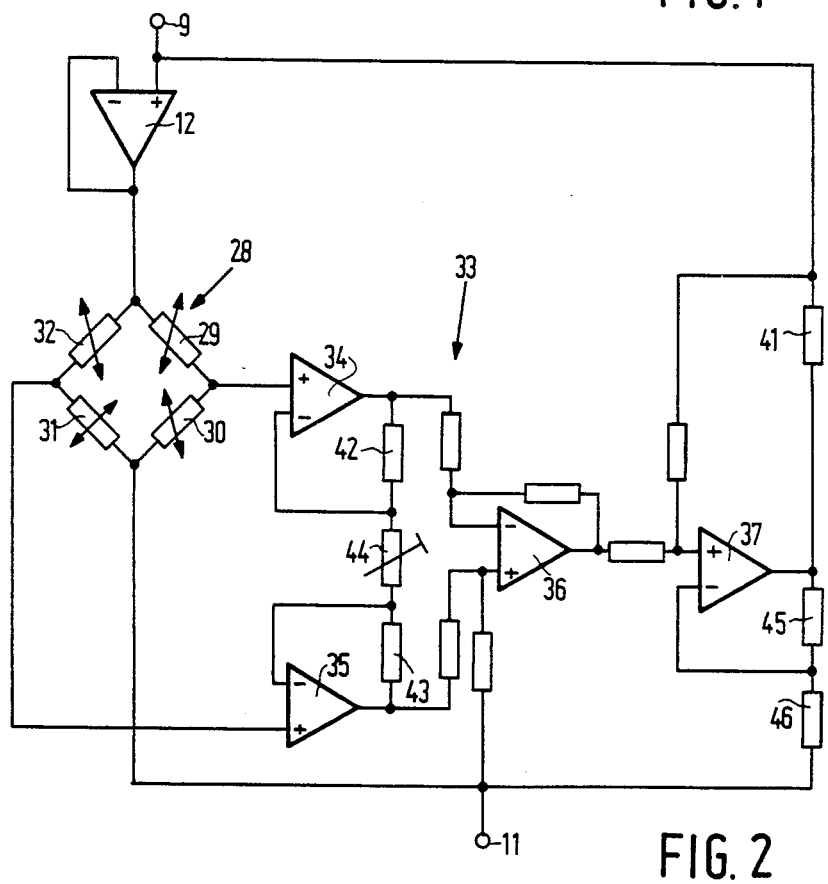
FIG. 2 shows a circuit diagram of the bipolar circuit arrangement used in the oscillator shown in FIG. 1.

The bipolar circuit arrangement 10 (see FIG. 2) comprises a voltage follower 12, which may be constructed, for example, as an operational amplifier whose input is connected to the first pole 9 of the circuit arrangement 10 and whose output is connected to one pole of the first diagonal branch of the quadrupolar bridge circuit 28. The quadrupolar bridge circuit consists of four resistance elements 29, 30, 31, 32, whose ohmic resistance value varies upon variation of the physical parameter which they detect. For force or pressure measurements, the resistance elements 29 to 32 may consist, for example, of strain gauges. The other pole of the first diagonal branch of the quadrupolar bridge circuit 28 is connected to the second pole 11 of the bipolar circuit arrangement 10. The two poles of the second diagonal branch of the bridge circuit 28 are each connected to a respective input of a differential amplifier circuit 33.

The differential amplifier circuit 33 may essentially be composed arbitrarily. However, according to FIG. 2, it comprises essentially two first operational amplifiers 34, 35, which are each fed back through their negative inputs and whose positive inputs are each connected to the respective poles of the second diagonal branch of the bridge circuit 28, as well as to a succeeding operational amplifier 36. The negative input of the operational amplifier 36 is connected to the output of the first operational amplifier 34 and the positive input of the operational amplifier 36 is connected to the output of the other first operational amplifier 35. The outputs of the operational amplifiers 34, 35 are fed back in known manner through resistors 42, 43 to their respective negative inputs, both negative inputs of the two operational amplifiers 34, 35 being connected to each other through an adjustable resistor 44 for adjusting the working-point of the differential amplifier circuit 33.

The output of the differential amplifier circuit 33, i.e. in this case the output of the operational amplifier 36, is connected to the input of a non-inverting amplifier 37, whose output is connected through a resistor 41 to the first pole 9 of the circuit arrangement 10. As a result, the detuning of the resistance measuring bridge is converted into a current proportional to the detuning at the terminal 9.

The output 3 of the all-pass filter 1 is connected on the one hand to a current source 16 and on the other hand to a control member 17, which has an input terminal 18 for supplying a nominal amplitude value, and whose output is connected to the control input of the current source 16 for controlling the current delivered by the current source. The current source 16 is connected through a 90° phase shift member 19 to the input 2 of the all-pass filter 1. The 90° phase shift member 19 is constructed, for example, as an inverting operational amplifier capacitively fed back negatively. The current source 16 may consist, for example, of an ohmic voltage divider 20, 21 connected to the output 3 of the all-pass filter 1 and whose centre tapping 22 is connected to the inverting input of the third operational amplifier 23 having a current output. Amplifier 23 has a control input 24 for adjusting the amplification factor and hence the value of the delivered current.

The control member 17 comprises a rectifier 25, which is connected to the output 3 of the all-pass filter 1 and which is connected in common with the input terminal 18 (for supplying the nominal amplitude value) to a summation point 26. The summation point 26 is connected to the inverting input of a smoothing device 27, which determines the negative linear average value of the alternating voltage delivered via the summation point 26 and supplies it to the control input 24 of operational amplifier 23. The smoothing device 27 may be constructed, for example, as an integration member having an inverting input.

The measuring oscillator therefore essentially consists of an amplifier 16, which is fed back positively through an all-pass filter 1 and thus oscillates at a frequency dependent upon the impedance values of the phase-determining capacitor 8 and of the phase-determining circuit element 10, 28. The amplitude of the alternating voltage delivered by the measuring oscillator is controlled by the control member 17 in such a manner that it assumes a constant value. For this purpose, the alternating voltage delivered by the all-pass filter 1 is rectified in the rectifier 25. In the summation point 26, the direct voltage of negative polarity supplied through the input terminal 18 and corresponding to the nominal amplitude value is added to the ripple direct voltage produced by the rectifier 25. The smoothing device 27 (having an inverting input) produces from the resulting alternating voltage a negative or positive direct voltage, which is supplied to the control input 24 of the operational amplifier 23 and which reduces or enlarges its amplification factor if the amplitude of the alternating voltage delivered by the all-pass filter 1 is larger or smaller than the given nominal amplitude value.

The differential amplifier circuit 33 contained in the bipolar circuit arrangement 10 produces, from the alternating voltage applied to the non-inverting input of the operational amplifier 7 and hence on the one hand applied to one terminal of the resistor 41 and on the other hand through the voltage follower 12 across the resistance elements 29, 32 of the bridge circuit 28, an alternating voltage which is in phase opposition thereto and which is applied to the other terminal of the resistor 41. The current flowing through the resistor 41 and hence the overall current flowing into the circuit arrangement 10 depends upon the difference of the voltages applied to the two terminals of the resistor 41 having different polarities. When the bridge circuit 28 is detuned, that is to say when the resistance value of the bridge circuit 28 varies with the variation of the physical parameter detected by the bridge circuit 28, the alternating voltage applied to the resistor 41 is varied by variation of the output signal of the differential amplifier circuit 33, which results in a variation of the current flowing into the circuit arrangement 10.

An increase of this current has the same meaning, however, as a decrease of the ohmic resistance of the circuit arrangement 10. The frequency of the alternating voltage produced by the measuring oscillator is inversely proportional to the ohmic resistance of the circuit element 10, 28 and hence is proportional to the physical parameter to be detected by the bridge circuit 28.

Furthermore, a non-inverting amplifier 37, whose amplification factor can be adjusted by corresponding proportioning of the resistors 45 and 46, can be arranged between the output of the operational amplifier 36 and the resistor 41. By variation of the resistor 41, the current can also be adjusted so that the ohmic resistance of the bipolar circuit element 10 and hence also the frequency of the alternating voltage produced by the measuring oscillator can thus be adjusted.

What is claimed is:

1. A measuring oscillator for detecting physical parameters by producing a signal having a frequency dependent upon the physical parameter and which comprises: an amplifier fed back positively through an all-pass filter, the all-pass filter comprising a phase-determining circuit element which comprises a bipolar circuit arrangement having a parameter-dependent ohmic resistance value whose resistance variation, which can be detected by the all-pass filter, is larger upon variation of the value of the parameter than the resistance value variation itself, characterized in that the bipolar circuit arrangement comprises four resistance elements cooperating in a quadrupolar bridge circuit and varying with the parameter.

2. A measuring oscillator as claimed in claim 1, characterized in that the bipolar circuit arrangement comprises a voltage follower, whose input is connected to a first pole of the bipolar circuit arrangement and whose output is connected to one pole of a first diagonal branch of the quadrupolar bridge circuit, means connecting the other pole of the first diagonal branch of the quadrupolar bridge circuit to a second pole of the bipolar circuit arrangement, two poles of a second diagonal branch of the bridge circuit each being connected to an input of a differential amplifier circuit, whose output signal controls, through the first pole, the current in the all-pass filter.

3. A measuring oscillator as claimed in claim 2, characterized in that the differential amplifier circuit comprises two first operational amplifiers, which are fed back through their negative inputs and whose positive inputs are each connected to the poles of the second diagonal branch of the bridge circuit, a succeeding third operational amplifier, whose positive input is connected to an output of one of the first operational amplifiers and whose negative input is connected to an output of the other first operational amplifier.

4. A measuring oscillator as claimed in claim 3, characterized in that an output of the differential amplifier circuit is connected to an input of a non-inverting amplifier having an output connected through a resistor to the first pole of the bipolar circuit arrangement.

5. A measuring oscillator as claimed in claim 4, characterized in that the resistance elements of the bridge circuit comprise strain gauges.

6. A measuring oscillator as claimed in claim 2 further comprising means for connecting an output of the differential amplifier circuit to an input of a non-inverting amplifier having an output connected via a resistor to the first pole of the bipolar circuit arrangement.

7. A measuring oscillator as claimed in claim 1 wherein at least some of the resistance elements of the bridge circuit comprise strain gauge elements.

* * * * *